(12) United States Patent
Huber

(10) Patent No.: US 12,085,733 B1
(45) Date of Patent: Sep. 10, 2024

(54) STEREOSCOPIC DISPLAY MODULES AND SYSTEMS HAVING OPTICALLY ISOLATED LIGHT EMITTERS

(71) Applicant: Liminal Space, Inc., Los Angeles, CA (US)

(72) Inventor: Nathaniel Huber, Hollywood, CA (US)

(73) Assignee: Liminal Space, Inc., Los Angeles, CA (US)

( * ) Notice: Subject to any disclaimer, the term of this patent is extended or adjusted under 35 U.S.C. 154(b) by 0 days.

(21) Appl. No.: 18/379,628

(22) Filed: Oct. 12, 2023

(51) Int. Cl.
*G02B 30/25* (2020.01)
*H01L 25/075* (2006.01)
*H01L 33/58* (2010.01)

(52) U.S. Cl.
CPC .......... *G02B 30/25* (2020.01); *H01L 25/0753* (2013.01); *H01L 33/58* (2013.01)

(58) Field of Classification Search
CPC ... G02B 30/25; H01L 25/0753; H01L 25/075; H01L 25/04; H01L 33/58; H01L 33/48; H01L 33/50; H01L 33/52; H01L 27/15; H01L 21/76; H01L 21/76264; H04N 13/332; H04N 13/337
USPC ....................................................... 359/465
See application file for complete search history.

(56) References Cited

U.S. PATENT DOCUMENTS

| | | | | |
|---|---|---|---|---|
| 2016/0274370 A1* | 9/2016 | Wu | ........................ | G02B 30/25 |
| 2018/0059429 A1* | 3/2018 | Huber | .................. | H04N 13/337 |
| 2021/0083152 A1* | 3/2021 | Biebersdorf | .......... | H01L 33/405 |
| 2022/0158047 A1* | 5/2022 | Shao | .................... | G02B 5/3025 |

OTHER PUBLICATIONS

COB and GOB LED: Features And Differences, https://www.colorlight-led.tech/cob-and-gob-led-features-and-differences/#respond), May 30, 2023, 19 pages.

* cited by examiner

*Primary Examiner* — Stephone B Allen
*Assistant Examiner* — Jyotsna V Dabbi
(74) *Attorney, Agent, or Firm* — Fish IP Law, LLP

(57) ABSTRACT

Light emitters are optically isolated from each other by a high opacity filler, resulting in a large percentage of the emitted light passing through the polarizers. Ideally, that arrangement causes all of the light from the light emitters to either be absorbed by the high opacity filler material, or pass up through an optional diffuser, a polarizer, and then through a low opacity coating that serves to protect the polarizers. In practice, at least 45% of light passing out of the device passes through a polarizer, more preferably at least 75% or even at least 90% of light passing out of the device passes through a polarizer. A diffuser is included under the polarizer.

23 Claims, 6 Drawing Sheets

STEREOSCOPIC DISPLAY MODULES AND SYSTEMS HAVING OPTICALLY ISOLATED LIGHT EMITTERS

FIELD OF THE INVENTION

The present invention generally relates to three-dimensional (3D) stereoscopic display modules and systems.

BACKGROUND

In a physical world viewing experience, each eye provides a slightly different image to the brain. Stereoscopic display systems attempt to recreate that visual experience using polarizers that present different views to each eye of a viewer.

Earlier attempts to recreate a real world visual 3D experience employed an apparatus similar to corrective eyewear, comprising lenses of different colors. A monitor or projector projected two views on one screen, with each view being color coded so as to be complementary to one eyewear lens or the other. The use of color to segregate viewing channels would often lead to headaches for the viewers.

Recent 3D designs focus on creating a 3D viewing experience within a traditional movie theater environment, using devices centering around a display on a lenticular screen constructed of fabric. However, limited stereoscopic viewing advancements have occurred outside the movie theater environment, including on billboards and other public media/advertising delivery devices. In general, it would be desirable to provide a 3D viewing experience using a wider range of devices, billboards, LED movie theater screens, stadium jumbotrons, and/or other large display devices

SUMMARY OF THE INVENTION

The inventive subject matter provides apparatus, systems, and methods in which light emitters are optically isolated from each other by a high opacity filler, resulting in a large percentage of the emitted light passing through the polarizers.

In preferred embodiments, individual pixels perceived by a viewer are associated with sets of light emitters. As used herein, each set of light emitters can alternatively be only a single emitter, multiple emitters, or light emitter packages. Light emitters are preferably light emitting diodes (LEDs). Where a set of light emitters has only a single emitter, the emitter is advantageously configured to selectively emit multiple colors. Where a set of light emitters has multiple emitters, each of the emitters preferably emits a different color. In light emitter packages, the LED or other light emitters are contained within a walled structure.

To provide the desired optical isolation, the high opacity filler extends from the substrate at least up to the bottom of the polarizers, and preferably up to the top of the polarizers. Ideally, that arrangement causes a high percentage of the light from the sets of light emitters to either be absorbed by the high opacity filler material, or passed up through an optional diffuser, a polarizer, and then through a low opacity coating that serves to protect the polarizers. In practice, at least 45% of light passing out of the device passes through a polarizer, more preferably at least 75%, and most preferably at least 90% of light passing out of the device passes through a polarizer.

All types of polarizers are contemplated, including linear (left and right) polarizers, and circular (left and right) polarizers.

Sets of light emitters, along with their corresponding polarizers, high opacity filler and low opacity coating, are preferably matrixed in module, in a checkerboard or other desired arrangement. Modules can contain any suitable number of sets of light emitters, including for example 64, 100, or even 1000 or more sets of light emitters. Hundreds or even thousands of modules can be arranged in a display.

Various resources, features, aspects and advantages of the inventive subject matter will become more apparent from the following detailed description of preferred embodiments, along with the accompanying drawing figures in which like numerals represent like components.

DETAILED DESCRIPTION

The following discussion provides many example embodiments of the inventive subject matter. Although each embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

The present designs are useful in overcoming issues with previous designs, by providing modules that include multiple light emitter/polarizer assemblies, bonded together by one or more high opacity fillers. Multiple instance of the modules can be readily combined into stereoscopic display systems.

It is to be understood that any type of encapsulated LED packages, or unencapsulated light emitters, can be employed in the current designs. Contemplated light emitters include RGBY, RGBW (white), RGB plus infrared, digital RGB, surface-mounted device LED package (SMDs), and quantum dot LEDs.

Figure 1:
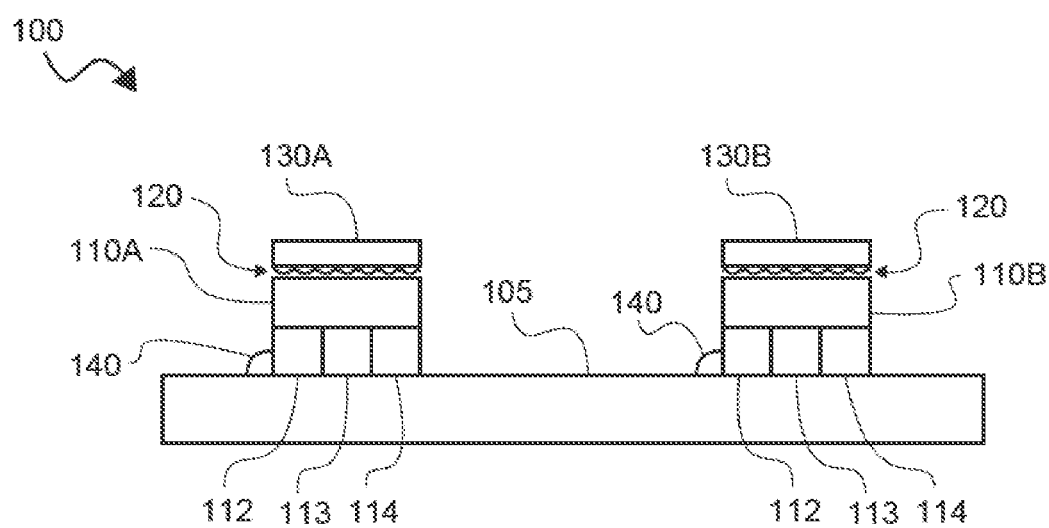
FIG. 1 is a prior art vertical cross-section of a module comprising first and second sets of light emitters mounted on a substrate.

FIG. 1A is a prior art vertical cross-section of a module 100 comprising first and second sets of light emitters 110A, 110B are mounted on a substrate 105. Each of the sets of light emitters 110A, 110B includes a red LED 112, a yellow LED 113, and a blue LED 114. Data/power lines 140 provide data and power to the LEDs 112, 113, 114. Above the first set of light emitters 110A is an adhesive 120, and a polarizer 130A. Above the second set of light emitters 110A is an adhesive 120, and a second polarizer 130B. First polarizer 130A polarizes light differently from second polarizer 130B, whether linearly or circularly.

The data and power connections are well-known to one of ordinary skill, and can be embedded within the substrate. The data and power can use the same or different connection.

Figure 2:
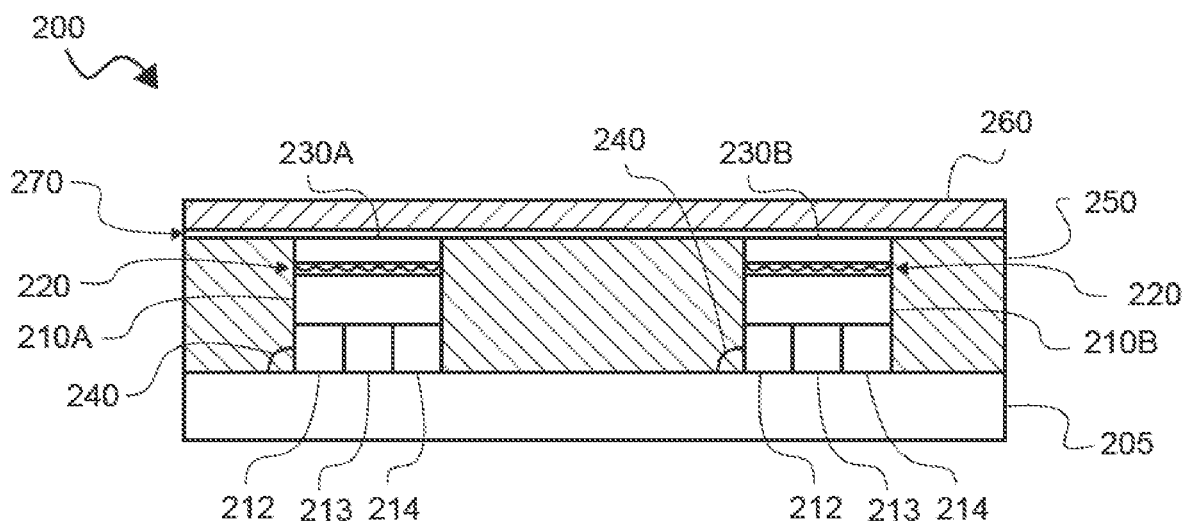
FIG. 2 is a vertical cross-section of a module comprising first and second sets of light emitter packages mounted on a substrate, optically separated by a high opacity filler extending up to the tops of the polarizers.

FIG. 2 is a vertical cross-section of a module 200 comprising first and second sets of light emitter packages 210A, 210B mounted on a substrate 205. Each of the sets of light emitter packages 210A, 210B includes a red LED 212, a yellow LED 213, and a blue LED 214. Data/power lines 240 provide data and power to the LEDs 212, 213, 214. Above the first set of light emitters 210A is an adhesive 220, an optional diffuser 270, and a polarizer 230A. Above the second set of light emitters 210A is an adhesive 220, and a second polarizer 230B. First polarizer 230A polarizes light differently from second polarizer 230B, whether linearly or circularly.

Figure 3:
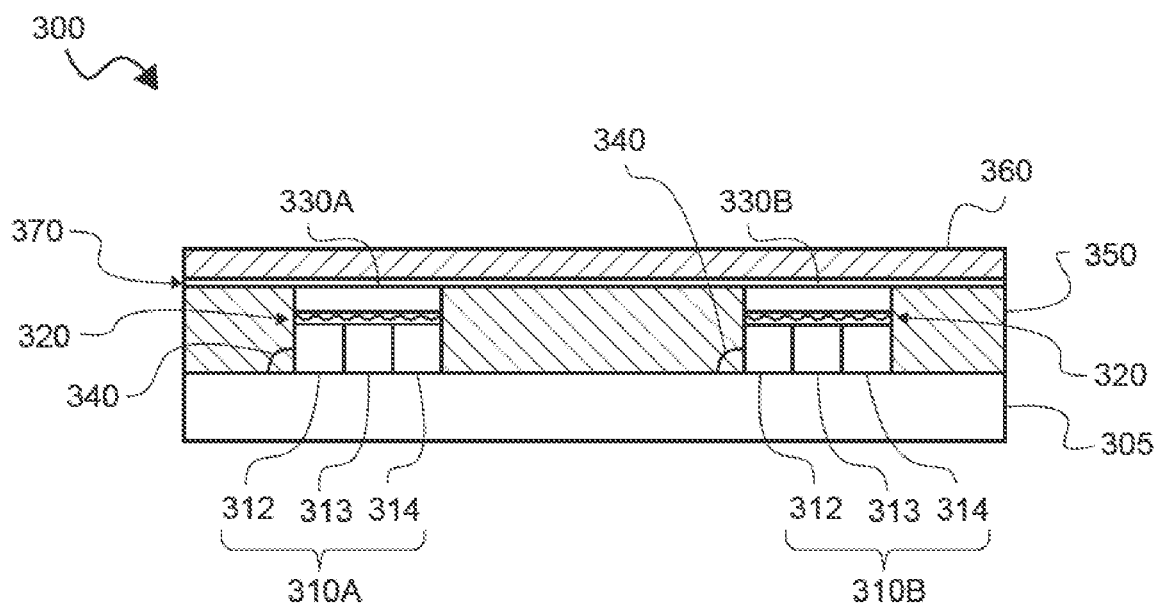
FIG. 3 is a vertical cross-section of a module comprising first and second sets of different colored light emitter diodes (LEDs) mounted on a substrate, optically separated by a high opacity filler extending up to the tops of the polarizers.

FIG. 3 is a prior art vertical cross-section of a module 300 comprising first and second sets of different colored light emitter diodes (LEDs) 310A, 310B mounted on a substrate 305. Each of the sets of light emitters 310A, 310B includes a red LED 312, a yellow LED 313, and a blue LED 314. Data/power lines 340 provide data and power to the LEDs 312, 313, 314. Above the first set of light emitters 310A is an adhesive 320, an optional diffuser 370, and a polarizer 330A. Above the second set of light emitters 310A is an adhesive 320, and a second polarizer 330B. First polarizer 330A polarizes light differently from second polarizer 330B, whether linearly or circularly. A high opacity filler 360 is disposed up to the top of the polarizers 330A, 330B, and a low opacity coating 370 covers the polarizers 330A, 330B and high opacity filler 360.

Figure 4:
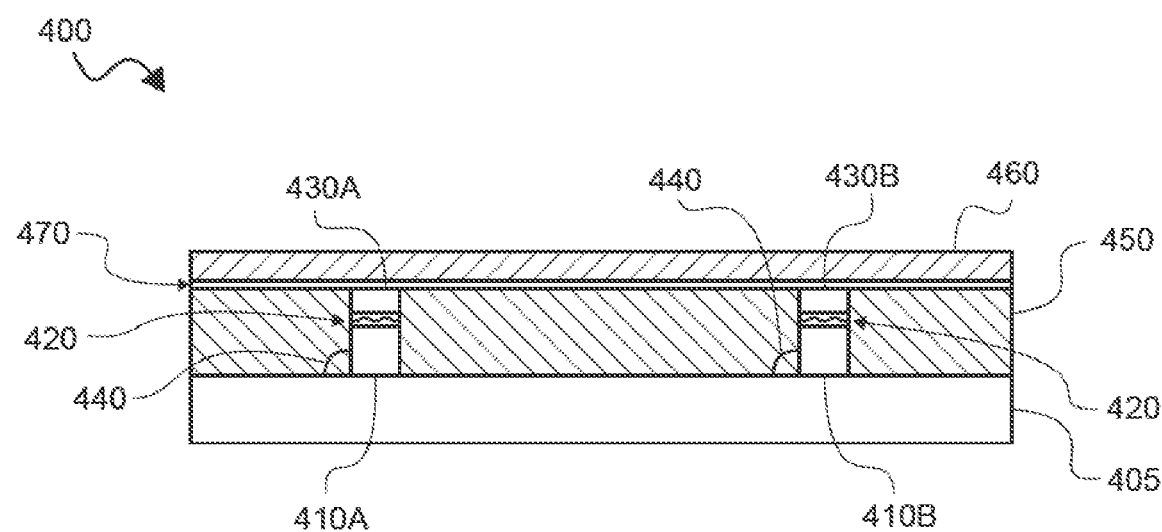
FIG. 4 is a vertical cross-section of a module comprising first and second single light emitting diodes (LEDs) mounted on a substrate, optically separated by a high opacity filler extending up to the tops of the polarizers.

FIG. 4 is a prior art vertical cross-section of a module 400 comprising first and second single light emitting diodes (LEDs) 410A, 410B mounted on a substrate 405. Each of LED's 410A, 410B can emit multiple colors separately or in combination. Data/power lines 440 provide data and power 440 to the LEDs 412, 413, 414. Above the first set of light emitters 410A is an adhesive 420, an optional diffuser 470, and a polarizer 430A. Above the second set of light emitters 410A is an adhesive 420, and a second polarizer 430B. First polarizer 430A polarizes light differently from second polarizer 430B, whether linearly or circularly.

Figure 5A:
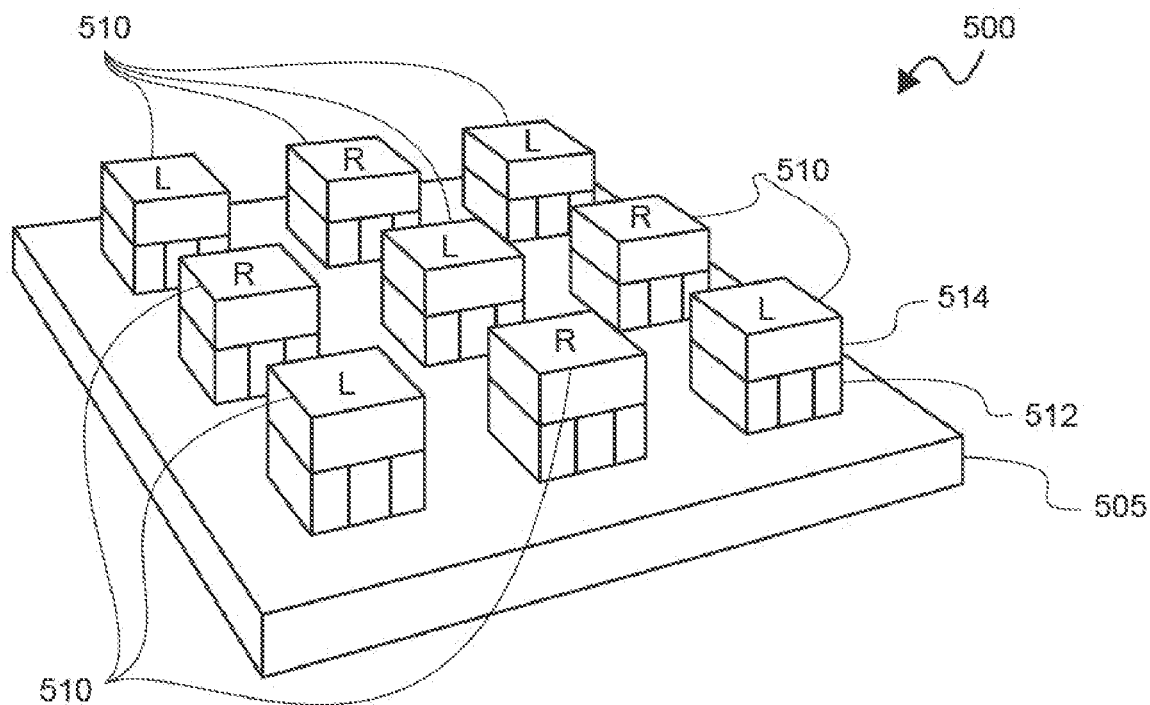
FIG. 5A is a top perspective view of a module comprising six sets of light emitters arranged in a checkerboard pattern, prior to addition of a high opacity filler material.

FIG. 5A is a top perspective view of a module 500 comprising nine assemblies 510 of sets of light emitters 512 and associated polarizers 514 are arranged in a checkerboard pattern, prior to addition of a high opacity filler material. The nine assemblies are disposed on top of substrate 505.

Figure 5B:
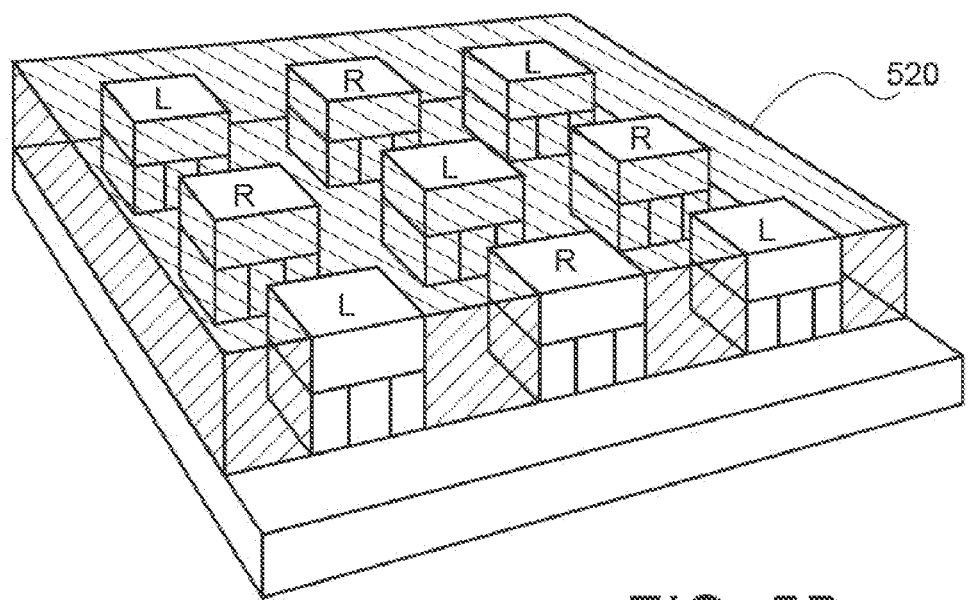
FIG. 5B is a top perspective view of a module of FIG. 5A, in which a high opacity filler material has been deployed up to the top of the polarizers.

FIG. 5B is a top perspective view of a module 500 of FIG. 5A, in which a high opacity filler material 520 has been deployed up to the top of the polarizers 514.

Figure 5C:
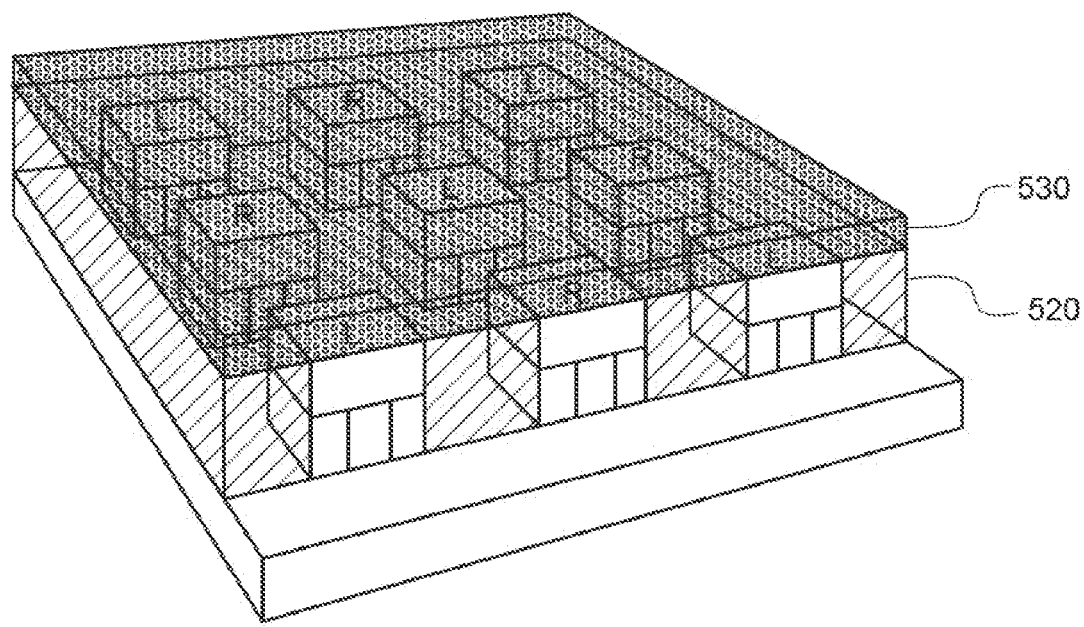
FIG. 5C is a top perspective view of a module of FIG. 5B, in which a low opacity coating has been placed on top of the high opacity filler opacity filler and polarizers.

FIG. 5C is a top perspective view of a module 500 of FIG. 5BA, in which a low opacity coating 530 has been placed on top of the high opacity filler opacity filler 520 and polarizers 514.

Figure 6:
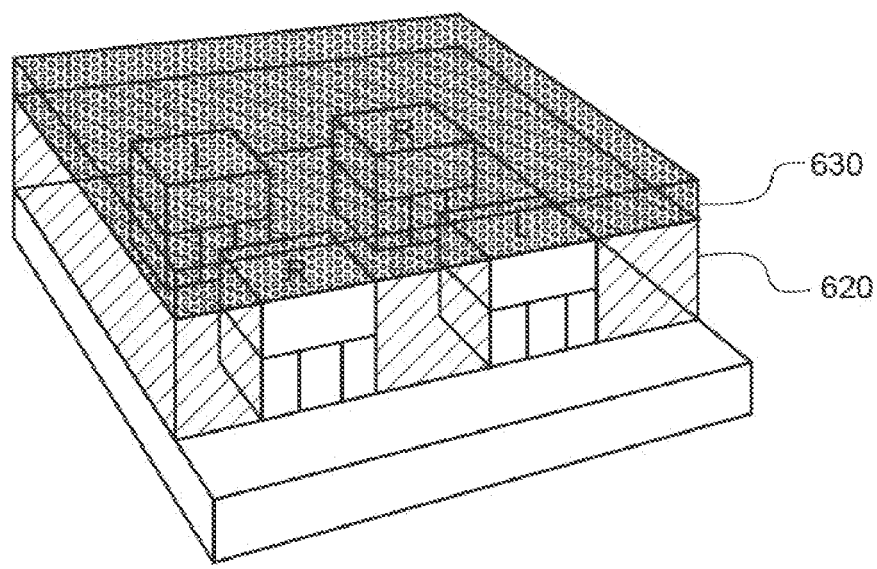
FIG. 6 a top perspective view of a module where even numbers of left and right polarizers are arranged in separate rows.

FIG. 6 a top perspective view of a module 600 where even numbers of assemblies 610 of sets of light emitters 612 and associated polarizers 612 are arranged such that alternating left and right polarizers 612 are arranged in rows.

Figure 7:
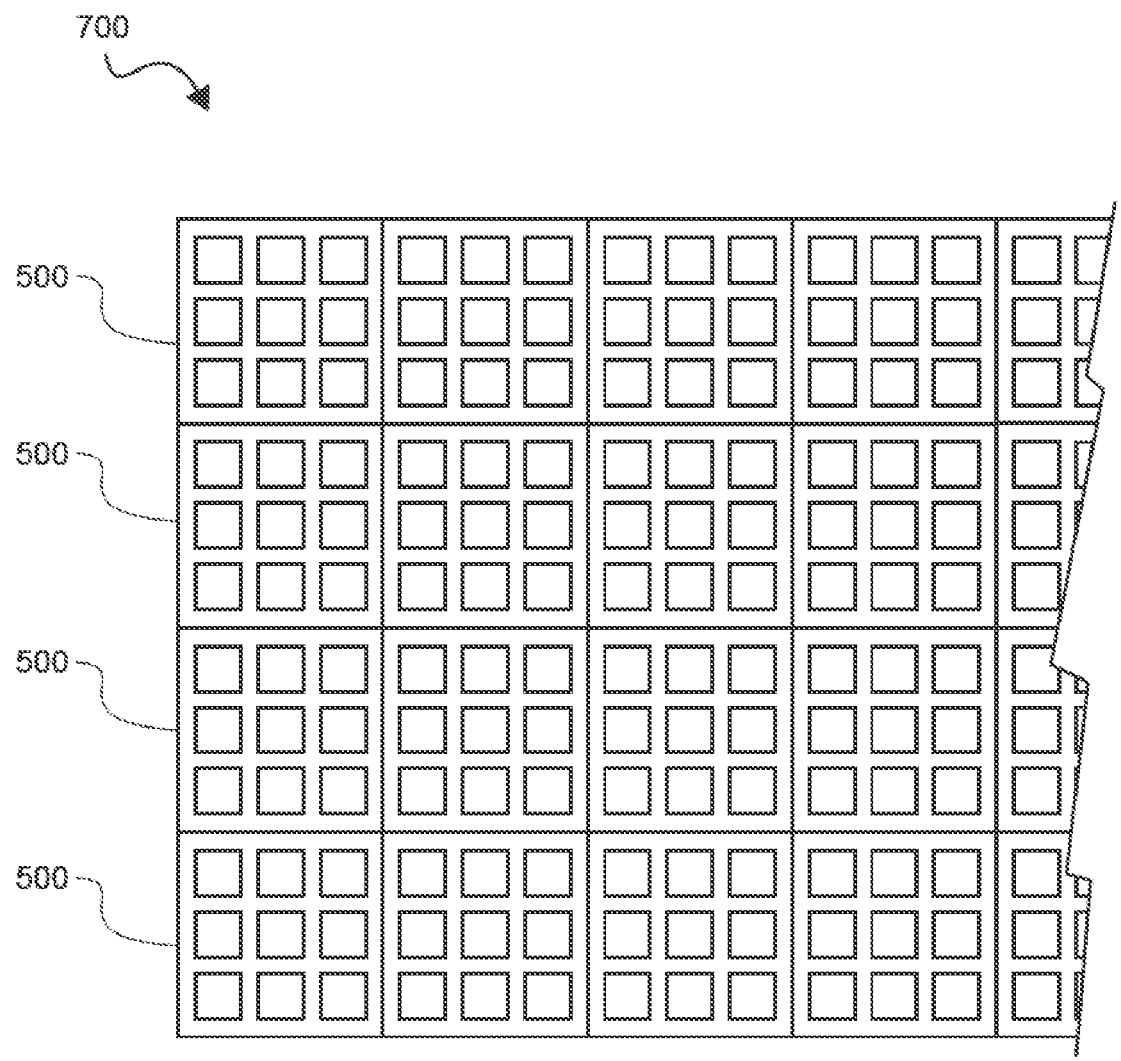
FIG. 7 is a top perspective view of a portion of a stereoscopic display system that includes at least 100 display modules, according to any of FIGS. 2-6.

FIG. 7 is a top view of a portion of a stereoscopic display system 700 that includes at least 100 display modules 710, according to any of FIGS. 2-6.

In each of FIGS. 2-7, the high opacity filler 250, 350, 450, extends between adjacent sets of light emitters, and up to at least the bottom of the corresponding polarizers (e.g., 230A, 230B, 330A, 330B, 420A, and 430B). More preferably, the high opacity filler opacity filler 250, 350, 450 extends up to at least the top of the polarizers. The opacity of the high opacity filler 250, 350, 450 is such that at least 45% of light passing out of the device passes through a polarizer, more preferably at least 75% or even at least 90% of light passing out of the device passes through a polarizer. High opacity filler 250, 350, 450 is preferably silicone or other resin, and is preferably made opaque by inclusion of graphene or acrylic pigments.

Low opacity coating 260, 360, 460 is preferably substantially transparent, at least to visible light. Suitable materials for low opacity coating include a two-part or UV cured resin.

Optional diffusers 270, 370, 470 can enhance the three-dimensional effect in at least two ways. First, without a diffuser, light from the light emitters can tend to "blow thru" polarizers, causing a ghosting effect that may detract from the viewing experience. Second, addition of a diffuser spreads out the light, creating a reduced lumens-per-square-millimeter value that enhances the polarization effect. In different contemplated embodiments, a diffuser can be placed above the polarizers to reduce glare and increase the effective viewing angle.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something designated from the group consisting of A, B, C . . . and N, the text should be interpreted as requiring only one element from the group, not A plus N, or B plus N, etc.

The invention claimed is:

1. A display module, comprising:
a substrate;
a matrix of at least first and second spaced apart sets of light emitters extending above the substrate;
first and second polarizers disposed above the first and second sets of light emitters, respectively;
a high opacity filler extending between the first and second sets of light emitters, and disposed at a height at least up to a bottom of each of the first and second polarizers;

a low opacity coating disposed above the first and second polarizers;

first and second diffusers disposed under the first and second polarizers, respectively; and wherein the high opacity filler is disposed about the first set of light A emitters, the first diffuser, and the first polarizer such that at least a combined total of 45% intensity of light between 400 and 750 nanometers, which passes out of the matrix from the first set of light emitters, passes through the first polarizer.

2. The display module of claim 1, wherein each of the first and second sets of light emitters emits at least three different colors.

3. The display module of claim 1, wherein each of the first and second sets of light emitters includes a single light emitting element addressable to produce a range of wavelengths between 400 and 750 nanometers.

4. The display module of claim 1, wherein each of the first and second sets of light emitters includes multiple light emitting elements that are collectively addressable to produce a range of wavelengths between 400 and 750 nanometers.

5. The display module of claim 1, wherein each of the first and second sets of light emitters includes a red light emitting diode (LED), LED, a green LED, and a blue LED.

6. The display module of claim 1, wherein each of the first and second sets of light emitters is distanced from the first and second polarizers, respectively.

7. The display module of claim 1, wherein the first and second polarizers polarize light in different directions.

8. The display module of claim 7, wherein the first and second polarizers polarize light in different circularly polarized directions, respectively.

9. The display module of claim 7, wherein the first and second polarizers polarize light in left and right directions, respectively.

10. The display module of claim 1, wherein the first polarizer is one of a total even number of left directional polarizers.

11. The display module of claim 1, wherein the first polarizer is one of a total odd number of left directional polarizers.

12. The display module of claim 1, wherein the first polarizer is one of a number left directional polarizers, and the second polarizer is one of a number of right directional polarizers, and the left and right polarizers are arranged in a checkerboard pattern.

13. The display module of claim 1, wherein the first polarizer is one of a number left directional polarizers, and the second polarizer is one of a number right directional polarizers, and the left and right polarizers are arranged in alternating rows.

14. The display module of claim 1, wherein the first and second polarizers are included within a polarizing film.

15. The display module of claim 1, wherein the high opacity filler comprises a resin.

16. The display module of claim 1, wherein the high opacity filler opacity transmits less than 80% of light transmitted by the low opacity coating of light between 400 and 750 nanometers, for total light intensity less than 20 lumens.

17. The display module of claim 1, wherein the high opacity filler opacity transmits less than 50% of light transmitted by the low opacity coating of light between 400 and 750 nanometers, for total light intensity less than 20 lumens.

18. The display module of claim 1, wherein the high opacity filler opacity transmits less than 20% of light transmitted by the low opacity coating of light between 400 and 750 nanometers, for total light intensity less than 20 lumens.

19. The display module of claim 1, wherein each of the first and second sets of light emitters is contained within a surface-mounted device LED package.

20. The display module of claim 1, further comprising:
third and fourth polarizers disposed above third and fourth set of light emitters;
the high opacity filler extending between the third and fourth set of light emitters, and having a height at least up to a bottom of each of the third and fourth second polarizers; and
the low opacity coating disposed above the third and fourth polarizers.

21. The display module of claim 1, wherein the matrix includes at least 100 of the sets of light emitters.

22. The display module of claim 1, wherein the matrix includes at least 1000 of the sets of light emitters.

23. The display module of claim 1, physically coupled with at least 99 other instances of the display module of claim 1.

* * * * *